United States Patent [19]

Boguslavsky et al.

[11] Patent Number: 4,957,058

[45] Date of Patent: Sep. 18, 1990

[54] MACHINE FOR APPLYING GAS-THERMAL COATINGS

[75] Inventors: Alexandr M. Boguslavsky; Viktor F. Semenikhin; Vladimir I. Chergikalo; Lev I. Rozenman; Yakov K. Tregub; Arkady I. Risman; Yankel M. Topopolsky; Egor V. Khatanzeisky; Eduard A. Rubin, all of Kiev, U.S.S.R.

[73] Assignee: Nauchno-Proizvodstvennoe Objedinenie Po Vypusku Mekhanicheskogo Svarochnog Oborudovanija, Kiev, U.S.S.R.

[21] Appl. No.: 397,441

[22] PCT Filed: Nov. 16, 1987

[86] PCT No.: PCT/SU87/00128

§ 371 Date: Jul. 14, 1989

§ 102(e) Date: Jul. 14, 1989

[87] PCT Pub. No.: WO89/04879

PCT Pub. Date: Jun. 1, 1989

[51] Int. Cl.$^5$ .............................................. B05C 1/02
[52] U.S. Cl. .................................... 118/323; 118/326
[58] Field of Search ................ 118/320, 326, 321, 323, 118/50, 50.1, 730, 728

[56] References Cited

U.S. PATENT DOCUMENTS 2,751,879 6/1956 Holtzman .......................... 118/326
2,779,690 1/1957 Gaiser ................................ 118/326
3,999,507 12/1976 Voermans ......................... 118/320
4,077,356 3/1978 Andrews .......................... 118/320

FOREIGN PATENT DOCUMENTS 2557149 6/1985 France .
656400 6/1986 Switzerland .
2174717 11/1986 United Kingdom .

OTHER PUBLICATIONS

Anon., "Rotomat Modular Equipment for Automatic Coating", Wear Control Tech., Losanna, Switz. (9–8-1981).
Anon., "Weellenspritz Bank Typ Wsp MIT Schallschutzhaube" Plasma-Technik AG, Wohmen, Switz. (1980).

Primary Examiner—Willard Hoag
Attorney, Agent, or Firm—Bruce E. Lilling

[57] ABSTRACT

The proposed machine comprises a chamber accommodating a headstock and a tailstock. The headstock has a rotation drive, whereas the tailstock is capable of longitudinal movement along a guide. The machine also includes a rod carrying a spray gun capable of lateral reciprocations by a drive in guides secured on the carriage capable of moving longitudinally by a drive along a guide. The tailstock has a hole, whereas a table of a size smaller than the dimensions of the hole is secured on the guide. A rear wall of the chamber has a longitudinal slot, the chamber having a gate capable of longitudinal displacement and engageable with a hollow pusher secured on the carriage and receiving the rod. The drives are arranged at the outer side of the rear wall of the chamber.

5 Claims, 6 Drawing Sheets

MACHINE FOR APPLYING GAS-THERMAL COATINGS

FIELD OF THE INVENTION

This invention relates to the art of applying gas-thermal coatings to workpieces by spraying, and more particularly to a machine for applying gas-theremal coatings.

BACKGROUND OF THE INVENTION

There is known an apparatus for applying gas-thermal coatings to workpieces in the form of bodies of revolution (cf., catalog of the firm "Wear Control Technology" published on Sept. 8, 1981 in Losanna, Switzerland and has the title "Modular Equipment for Automatic Coating"). This apparatus comprises a headstock with a rotation drive and a tailstock with a common center of axis. The tailstock is secured on a guide for longitudinal displacement. The same guide has a carriage secured thereon to be capable of longitudinal reciprocations.

The apparatus further includes a rod carrying a spray gun and capable of lateral reciprocations in guides secured on the carriage. The rod is provided with a clam for locking it laterally in position relative to the center axis. A workpiece in the form of a body of revolution is mounted between the tailstock and headstock. The tailstock is then brought closer to the end of the workpiece. After securing the workpiece between the centers of the tialstock and headstocks the rod carrying the spray gun is brought to a position determined by the diameter of the workpiece and present distance from the spray gun to the surface of the workpiece by moving the rod laterally. This position of the rod is locked. The rotation drive is then energized, ingredients of the coating mixture are fed to the spray gun, and the carriage executes longitudinal reciprocations preset by the production process. As the lateral position of the rod carrying the spray gun is locked, coatings can be applied only to cylindrical workpieces. When applying the coating, part of the powder-like material falls onto the guide of the tailstock to impede its travel on the guide and cause premature wear of the latter.

There is also known a machine for applying gas-thermal coatings to workpieces (cf., catalog of the firm PLASMA-TECHNIK AG, published in 1980 in Wohmen Switzerland, and has the title Weellenspritzbank Typ WSP mit Sehallschutzhaube) comprising a chamber, accommodating a headstock having a rotation drive and a tailstock with a guide capable of longitudinal travel along this guide coaxially arranged inside the chamber. The machine also includes a carriage having a drive and a guide, and capable of longitudinal reciprocations along the guide, and a rod carrying a spray gun for lateral displacement in guides secured on the carriage. The guide of the tailstock, guide of the carriage, and drive for imparting longitudinal movement to the carriage are positioned inside the chamber, whereas the guide of the tailstock is arranged under the spray gun. With doors of the chamber open the workpiece in the form of the body of revolution is clamped between the centers of the headstock and tailstock. The rod carrying the spray gun is moved laterally to a position determined by the diameter of the workpiece and preferred distance between the spray gun and surface of the workpiece. The doors of the chamber are then closed. The rotation drive for rotating the workpiece is energized. Ingredients of the material to be applied are fed to the spray gun, and the carriage executes longitudinal reciprocations according to the production program. When applying coatings to a cylindrical workpiece of continuous diameter, the lateral position of the rod carrying the spray gun remains invariable through the entire coating application cycle. When applying coatings to a workpiece of varying diameter, the rod carrying the spray gun is moved laterally to a distance equal to the difference in the workpiece radii.

Because this prior art machine is intended primarily for applying coatings to cylindrical workpieces of small diameter, and consequently of small surface area, and time of continuous operation of the spray gun and drives is relatively short. Therefore, the operability of the drives and guides functioning in the zone of high temperatures and dust released by the spray gun for a short period of time is unaffected.

However, this known machine is not capable of applying coatings to flat workpieces, as this necessitates extra motions to be executed by the spray gun and requires that the flat workpiece be secured in the chamber. In addition, application of coatings of flat workpieces having large surface areas needs a longer time of continuous operation of the spray gun, which negatively affects the functioning and reduces the service life of drives and guides present in the zone of high temperature and atmosphere of dust. Arrangement of the guide of the tailstock under the spray gun promotes penetration of powdered material being sprayed onto the guide thereby impeding the movement of the tailstock therealong and making it more susceptible to premature wear.

SUMMARY OF THE INVENTION

The present invention aims at providing a machine for applying gas-thermal coatings to workpieces which would be so constructed that by allowing simultaneous longitudinal and lateral reciprocations of a spray gun, as well as by securing flat workpieces in the working chamber and providing conditions for extensive operation of the machine, it would be possible to expand production capabilities and improve the reliability of the machine.

The aim of the invention is attained by that in a machine for applying gas-thermal coatins to workpieces comprising a box-like chamber, the chamber accommodating a headstock provided with a rotation drive, and a tailstock having a guide and capable of longitudinal motions relative to the workpiece along this guide, a carriage having a drive and a guide, the carriage being capable of longitudinal reciprocations along the guide relative to the workpiece, a rod carrying a spray gun and capable of lateral displacements relative to the workpiece in guides secured on the carriage, according to the invention, the machine is provided with a table secured on the guide of the tailstock, the guide having a hole or window of a size exceeding the cross section of the table, a drive for imparting reciprocating motions to the rod relative to the workpiece, and an arrangement for changing the travel distance of the rod operatively connected therewith, a rear wall of the chamber having a longitudinally extending slot, whereas the chamber has a gate slidable longitudinally relative to the workpiece and engageable with a hollow pusher which is secured on the carriage and receives the rod, the drive of the carriage and drive for imparting lateral reciprocations to the rod, as well as guides of the carriage and rod being accommodated at the outer side of the rear wall of the chamber.

Preferably, the drive from imparting lateral reciprocations to the rod has the form of a cam and a double-arm lever one arm of which is connected to a cam, whereas the other arm is connected to the rod.

Desirably, the arrangement for changing the distance traveled by the rod comprises two slides capable of displacement in grooves, one such groove being provided in the carriage, whereas the other such groove is made in the double-arm lever of the drive for imparting lateral reciprocations to the rod, and a pivot pin secured in the slides.

Advantageously, the length and width of the table exceed the dimensions of planes of the guide of the tailstock engageable with the tailstock.

For applying coatings to workpieces in the form of bodies of revolution of non-cylindrical shape it is necessary that the cam of the drive from imparting lateral reciprocations to the rod should have a shape conforming to the shape of the surface of the workpiece to which the coating is applied.

The proposed machine ensures application of coatings to flat workpieces, as well as to bodies of revolution of cylindrical and other than cylindrical shapes.

BRIEF DESCRIPTION OF THE DRAWINGS

The invention will now be described in greater detail with reference to a specific embodiment thereof taken in conjunction with the accompanying drawings, in which.

BEST MODE OF CARRYING OUT THE INVENTION

Figure 1:
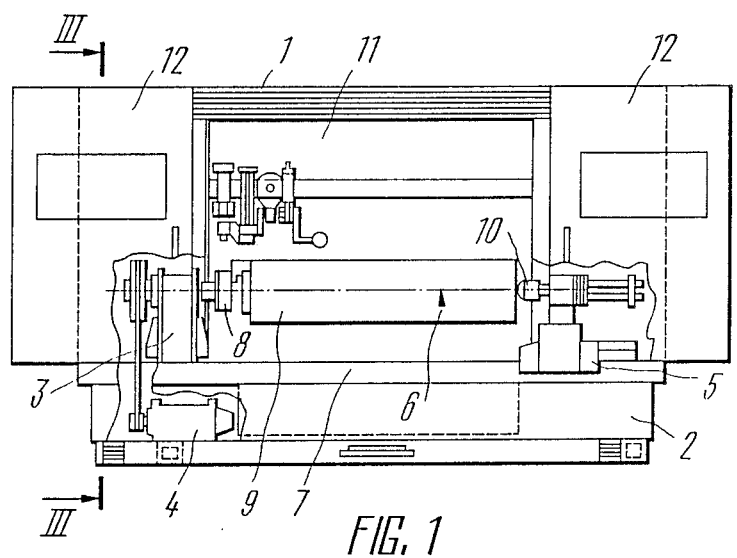
FIG. 1 is a front view of a machine for applying gas-thermal coatings according to the invention.

A machine for applying gas-thermal coatings comprises a box-like chamber 1 (FIG. 1) mounted on a bed 2, the chamber 1 accommodating a headstock 3 having a rotation drive 4, and a tailstock 5 with a common center axis 6. The tailstock 5 is secured on a guide to be capable of longitudinal movement and lockable in position (the lock means is not shown). The headstock 3 has a chuck 8 for clamping a workpiece 9 in the form of a body of revolution revolving about the axis 6, the tailstock 5 having a rotating center 10. The chamber 1 includes a rear wall 11 and sliding doors 12 at the front portion thereof.

Figure 3:
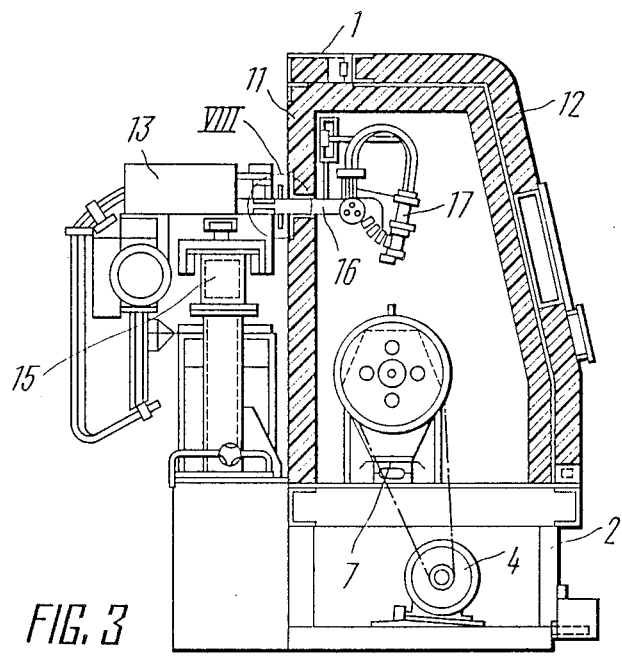
FIG. 3 is a section taken along the line III—III in FIG. 1.

The machine further comprises a carriage 13 (FIG. 2) with a drive 14 for imparting reciprocations relative to the workpiece 9 along guide 15. The carriage 13 carries a rod 16 with a spray gun 17. The rod 16 is secured in guides 18 mounted on the carriage 13 to be capable of lateral reciprocations relative to the workpiece 9 ensured by the drive 19. The drives 14 and 19, as well as guides 15 and 18 are arranged at the outer side of the rear wall 11 of the chamber 1 (FIG. 3). Secured on the guide 7 is a table 20 (FIG. 4) accommodating a substantially flat workpiece 21. The length and width of the table 20 are greater than the corresponding dimensions of planes 22 of the guide 7 engageable with the tailstock 5. The tailstock 5 has a window 23 of a size exceeding the cross section of the table 20.

Figure 5:
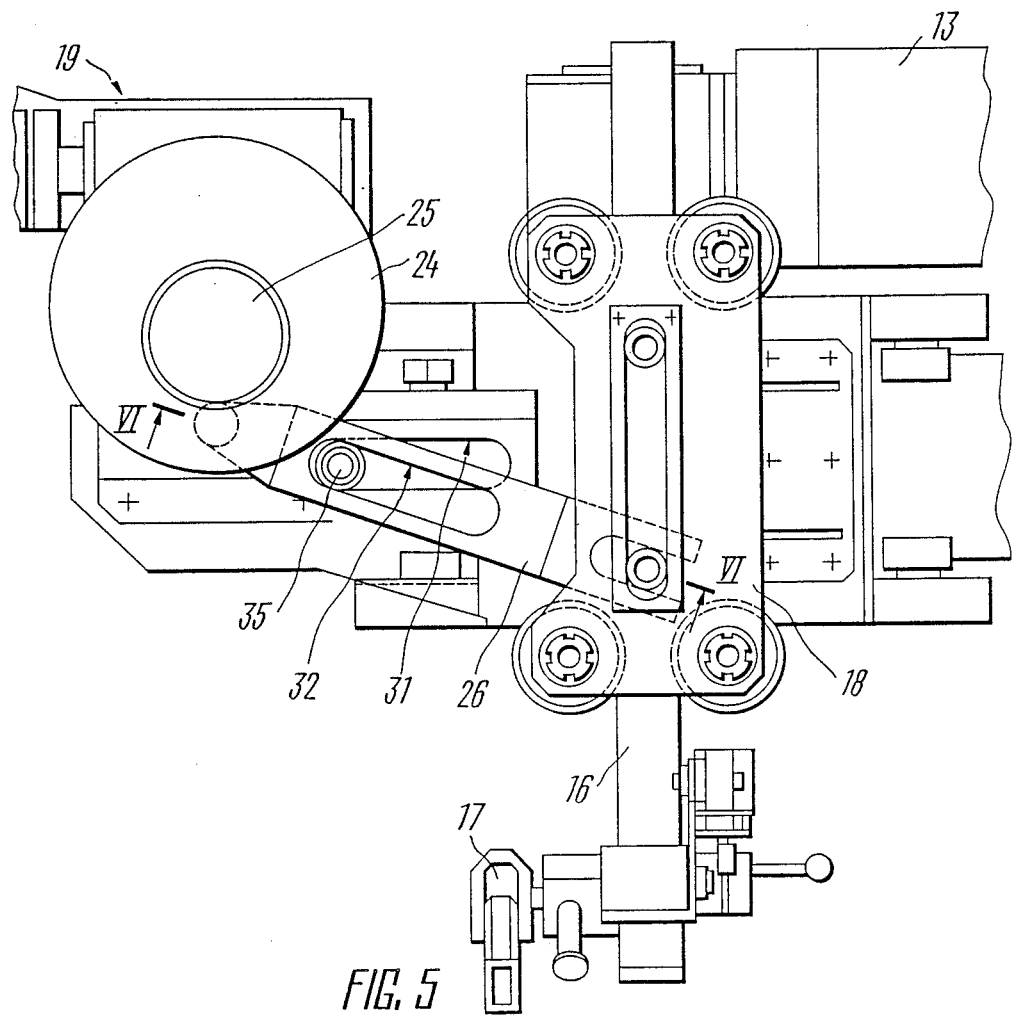
FIG. 5 shows the construction of a drive for imparting lateral reciprocations to a rod.
Figure 6:
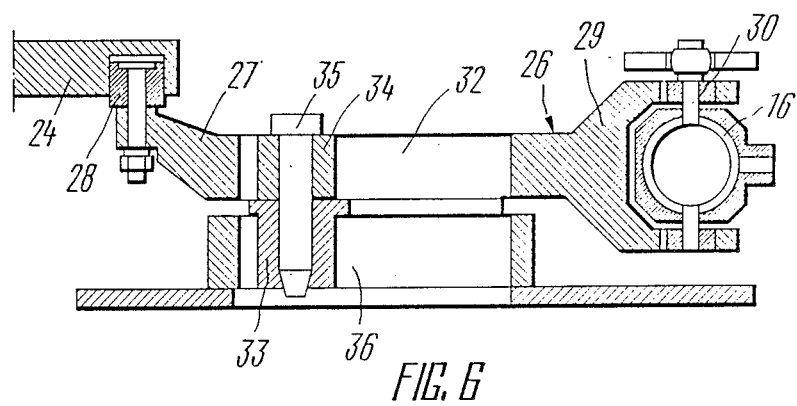
FIG. 6 is a section taken along the line VI—VI in FIG. 5.

The drive 19 (FIG. 5) for imparting reciprocations to the rod 16 is fashioned as a cam member 24 secured on a drive shaft 25 and a double-arm lever 26 (FIGS. 5, 6) an arm 27 of which is connected by a roller 28 to the cam 24, whereas the arm 29 is connected by a pivot 30 to the rod 16. The carriage 13 has a groove 31, whereas the lever 26 is provided with a longitudinal groove 32. The grooves 31 and 32 receive slides 33, 34 of arrangements for metering the stroke of the rod 16. The slides 33 and 34 are capable of adjustable displacements in the grooves 31 and 32 to be locked in position be a lock means (not shown). A pivot pin 35 is secured int he slides 33 and 34.

Figure 7:
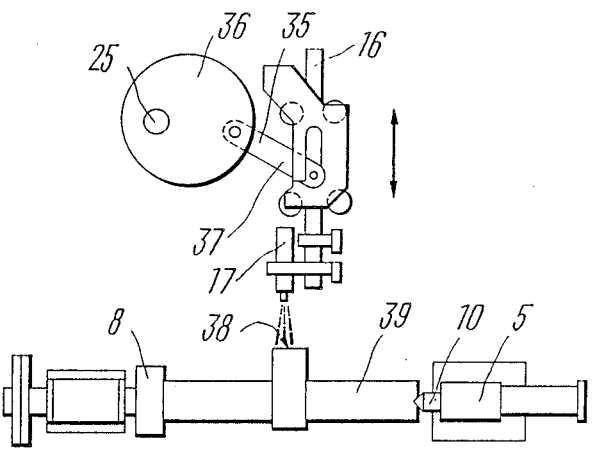
FIG. 7 shows diagrammatically the proposed apparatus when applying coatings to a workpiece in the form of a non-cylindrical body of revolution.

With reference to FIG. 7, the drive 19 is provided with a replaceable cam 36 at the drive shaft 35 and a replaceable double-arm lever 3 connected to the cam 36 and to the rod 16. The shape of the cam 36 corresponds to the shape of the surface 38 of a workpiece 39 which is a body of revolution of a configuration other than cylindrical.

Figure 8:
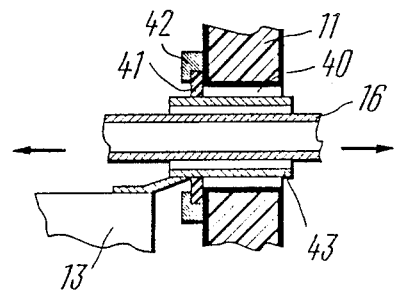
FIG. 8 is a partial cross section of the rear wall of the working chamber of the apparatus according to the invention.
Figure 9:
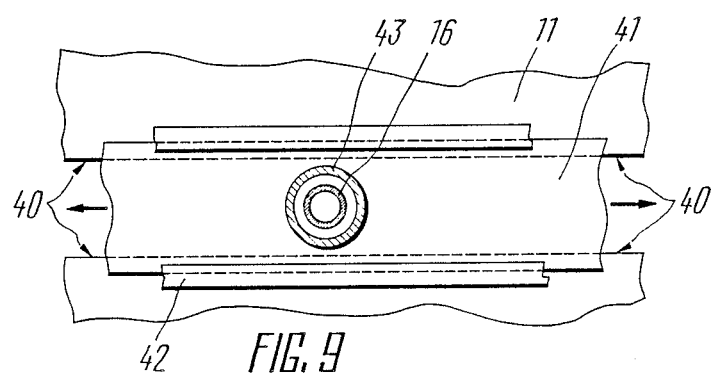
FIG. 9 is a partial rear view of the rear wall of the chamber.

The rod 16 extends into the chamber 1 through a slot 40 (FIG. 8) provided in the rear wall 11 of the chamber 1 along the travel path of the carriage 13. For providing thermal and acoustic insulation of the chamber 1 from the outside the slot 40 is closed by a strip gate 41 of a width exceeding the width of the slot 40. The gate 41 is secured in guides 42 (FIGS. 8 and 9) to be capable of longitudinal movement, and to engage with a hollow pusher 43 which is secured on the carriage 13. The rod 16 is positioned inside the hollow pusher 43 with a clearance. Mounted on the front end of the rod 16 on a pivot 44 (FIG. 10) having axis thereof running in parallel with the center axis 6 is a pivotable bracket 45. The spray gun 17 is secured on the bracket 45 to be capable of adjustable vertical displacements, whereas the bracket 45 is connected to a pneumatic cylinder 46 pivotably secured on a bracket 47 affixed to the rod 16. The pneumatic cylinder 46 is connected via an air distributor 48 and a relay 49 to a starter 50 of the drive 4 (FIG. 1) for rotating the headstock 3, to a starter 51 (FIG. 10) of the drive 14 (FIG. 2) for moving the carriage 13, and to a drive 52 (FIG. 10) of the drive 19 (FIG. 2) for moving the rod 16.

The machine operates in one of two preselected modes determined by the type of the workpieces (a body of revolution of a flat workpiece).

Figure 2:
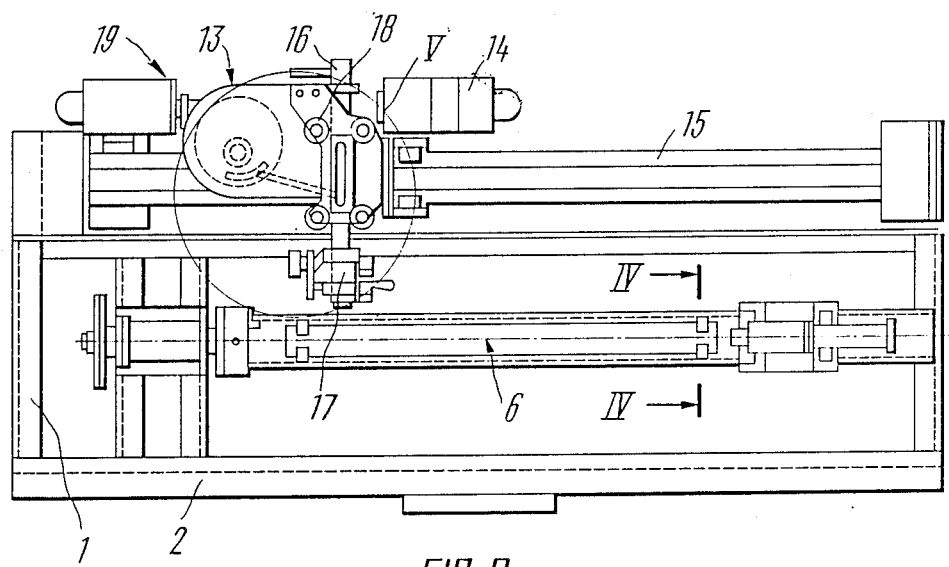
FIG. 2 is a top plan view of the proposed machine with the working chamber removed.

When applying coatings to the workpiece 9 (FIG. 1) in the form of a body of revolution the proposed machine operates in the following manner. Depending on the diameter of the workpiece 9, the spray gun 17 (FIG. 10) is moved along the bracket 45 to set it to the vertical position. When charging the workpiece 9 (FIG. 1), the doors 12 are spread, the rod 16 (FIG. 2) with the spray gun 17 is moved toward the rear wall 11 (FIG. 1), whereas the spray gun 17 with the bracket 45 is turned to an inclined non-working position. The workpiece 9 (FIG. 1) is fitted into the chuck 8 of the headstock 3 and clamped by the center 10 of the tailstock 5. The process conditions are then present, viz., rotational speed of the chuck 8, travel speed of the carriage 13 (FIG. 2), travel distance of the carriage 13 depending on the length of the workpiece 9, and number of reciprocations executed by the carriage 13. The doors 12 are then closed. The rotation drive 4 is energized accompanied by feeding ingredients of the coating to the spray gun 17 (FIG. 2). The rod 16 moves the spray gun 17 away from the rear wall 11 bringing it in the working position over the workpiece 9 (FIG. 1). The pneumatic cylinder 46 (FIG. 10) and drive 14 (FIG. 2) are simultaneously engaged, whereby the spray gun 17 assumes the vertical position, and the carriage 13 starts to move the spray gun 17 lengthwise of the workpiece 9 (FIG. 1). The coating is applied to the workpiece 9 according to a present program by rotating the workpiece 9 at a continuous rate and reciprocating the spray gun 17 (FIG. 2) along the upper generating line of the workpiece 9 (FIG. 1). During reciprocations of the carriage 13 the hollow pusher 43 (FIG. 8) secured thereon acts to move the strip gate 41 in the guides 42. During unexpected stops of the rotation drive 4 (FIG. 1) or drive 14 (FIG. 2) for imparting movement to the carriage 13 the starter 50 (FIG. 10) or 51 come into action to automatically transmit a signal through the relay 49 to the air distributor 48 for the pneumatic cylinder 46 to turn the spray gun 17 (FIG. 2) to the inclined non-working position in which the ingredients of the coating fail to fall onto the workpiece 9 (FIG. 1). During inadvertent stops of the drives 4 and 14 (FIG. 2) causing termination of the movement of the spray gun 17 and workpiece 9 (FIG. 1) application of the coating to the surface of the workpiece 9 is prevented. In the course of operation of the spray gun 17 a quantity of the powder material falls down. The table 20 (FIG. 4) reliably protects the surfaces 22 of the guide 7 against falling of this material onto this surface 22.

After the program of applying the coating onto the workpiece 9 (FIG. 1) ends, the drives 4 and 14 (FIG. 2) are automatically deenergized, the starters 50 and 51 (FIG. 10) issue a signal for turning the spray gun 17 to the inclined position, the rod 16 with the spray gun 17 is moved toward the rear wall 11 (FIG. 1) of the chamber 1, feeding of the ingredients of the coating is terminated, and the doors 12 are opened. The tailstock 5 is moved away from the end face of the workpiece 9, the chuck 8 is unclamped, and the workpiece 9 is removed from the chamber 1.

The cycle is then repeated.

Figure 10:
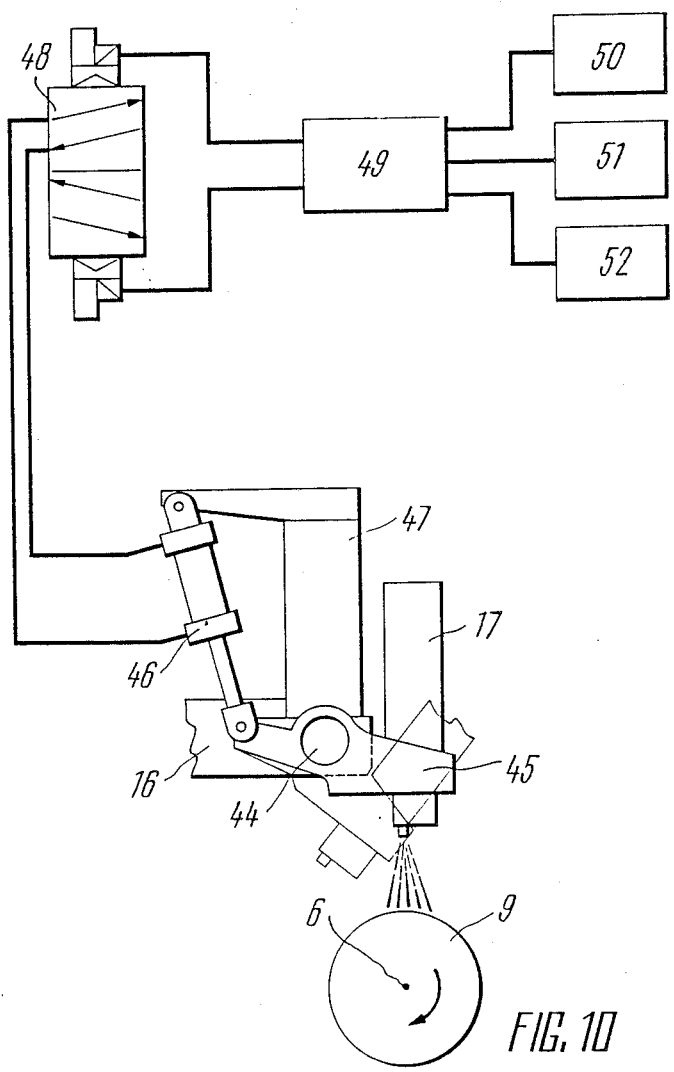
FIG. 10 shows the arrangement of a spray gun on the rod.

When applying coatings to workpieces 21 (FIG. 4) of flat configuration, the proposed machine operates as follows. With the doors 12 (FIG. 1) open, the tailstock 5 is moved to the extreme right-hand position. The workpiece 21 (FIG. 4) is placed on the table 20, and, if necessary, secured thereon. Therewith, the rod 16 (FIG. 2) with the spray gun 17 is moved toward the rear wall 11 (FIG. 1) of the chamber 1, whereas the carriage 13 rests in one of the extreme positions. Depending on the height of the workpiece 21 (FIG. 4) the spray gun 17 is set to the vertical position relative to the surface of the workpiece 21 (FIG. 4) by moving the spray gun 17 (FIG. 2) along the bracket 45 (FIG. 10). Depending on the width of the workpiece 21, the distance of the crosswise movement of the rod 16 (FIG. 2) with the spray gun 17 is preset. With this aim in view, the slides 33 and 34 (FIG. 6) are displaced in the grooves 31 and 32 (FIG. 5) thereby changing the relationship between the length of the arms 27 and 29, and consequently the distance of travel of the rod 16. After moving the slides 33 and 34 (FIG. 6) to the required distance they are locked in position in the grooves 31 (FIG. 5) and 32.

Figure 4:
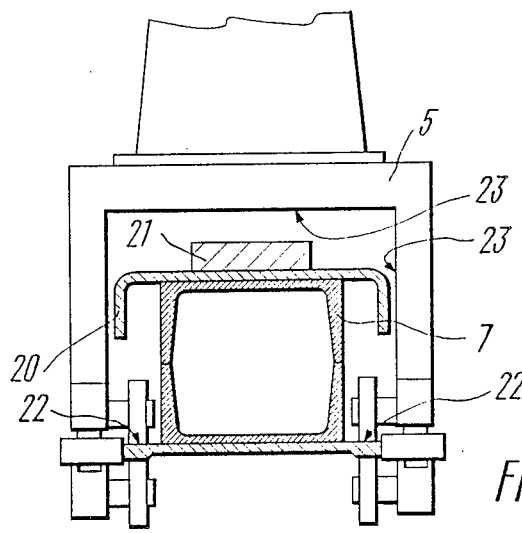
FIG. 4 is a section taken along the line IV—IV in FIG. 2.

The process conditions are then present: speed of travel of the carriage 13 (FIG. 1), distance of movement of the carriage 13 determined by the length of the workpiece 21 (FIG. 4), number of reciprocations executed by the carriage 13 (FIG. 1), and the speed of movement of the rod 16 (FIG. 2). The doors 12 (FIG. 1) of the chamber 1 are closed. The drive 14 (FIG. 2) of the carriage 13 and the drive 19 of the rod 16 are energized. Ingredients of the coating to be applied are fed to the spray gun 17. The coating is then applied to the workpiece 21 (FIG. 4) according to the preset program through executing longitudinal and lateral reciprocations of the spray gun 17 (FIG. 2) in the horizontal plane over the surface of the workpiece 21 (FIG. 4). During movements of the rod 16 (FIG. 2) it freely passes inside the hollow pusher 43 (FIG. 8) in the lateral direction to move therewith longitudinally.

In response to unexpected stops of the drive 14 (FIG. 2) or drive 19 the starter 51 (FIG. 10) or 52 comes into action to automatically issue a signal via the relay 49 to the air distributor 48 for the pneumatic cylinder 46 to turn the spray gun 17 to the inclined non-working position in which the ingredients of the coating fail to fall onto the surface of the workpiece 21 (FIG. 4). Upon terminating the coating application program the drives 14 (FIG. 2) and 19 are deenergized. The spray gun 17 stops in the initial position, i.e. moves to the rear wall 11 (FIG. 1) of the chamber 1. Feeding of the coating ingredients stops, the doors 12 open, and the wordpiece 21 (FIG. 4) is evacuated from the chamber 1 (FIG. 1) after which the cycle is repeated.

When applying a coating to the workpiece 39 (FIG. 7) in the form of a body of revolution of a shape other than cylindrical, the machine operates as follows.

The replaceable cam 36 is secured on the drive shaft 25, whereas the double-arm lever 37 connected to the cam 36 and rod 16 is secured on the pivot pin 35. The wordpiece 39 is mounted in the chuck 8 and, if necessary, clamped by the rotating center 10 of the tailstock 5.

By superimposing the movements of the carriage 13 (FIG. 2) and rod 16 (FIG. 7) the spray gun 17 is brought to a present distance from the non-cylindrical surface 38 of the workpiece 39.

The process conditions are then preset: rotational speed of the chuck 8, speed of movement of the carriage 13 (FIG. 2), distance of travel of the carriage 13 determined by the length of the surface 38 (FIG. 7), number of reciprocations executed by the carriage 13 (FIG. 2), and rotational speed of the cam 36 (FIG. 7) determined by the rotational speed of the chuck 8. With the doors 12 (FIG. 1) closed the rotation drive 4 and the drive 19 (FIG. 2) for imparting movement to the rod 16 are energized, after which the drive 14 for moving the carriage 13 is actuated and the ingredients of the coating are fed to the spray gun 17.

Application of coatings to a surface 38 (FIG. 7) of a shape other than cylindrical is carried out according to a preset program with the workpiece 39 rotating, the carriage 13 executing reciprocations, and the rod 16 moving transversely. As the shape of the cam 36 (FIG. 7) corresponds to the shape of the surface 38, the distance from the spray gun 17 to the surface 38 is constant during rotation of the workpiece 39.

Upon terminating the program of coating application the drives 4 (FIG. 1) and drives 14, 19 (FIG. 2) are automatically deenergized, feeding of the ingredients of the coating stops, the doors 12 slide open, and the workpiece 39 (FIG. 7) is removed, after which the cycle is repeated.

If it is necessary to sand-blast the surface of the workpiece, an appropriate arrangement is mounted on the rod 16 instead of the spray gun 17 (FIG. 2). Other associated operations are substantially the same as described above.

The proposed machine makes it possible to substantially expand production capabilities of existing machines for applying gas-thermal coatings.

Provision of the table 20 (FIG. 4) and of the drive 19 (FIG. 2) for imparting to the rod 16 with the spray gun 17 a transverse movement allows application of coatings to workpieces of a shape other than a body of revolution, such a flat workpiece. In addition, provision of the cam mechanisms affords application of coatings to workpieces in the form of bodies of revolution of a shape other than cylindrical. This mechanism is simpler and less expensive than the known mechanisms in which the travel regularity is present by costly programming.

Arrangement of the drives 14, 19 and guides 15, 18 of the carriage 13 and rod 16 outside the chamber 1 (FIG. 1) makes them unaffected by high temperature or dust to result in their higher operability and wear resistance during extensive operation of the spray gun 17 (FIG. 2) which is essential for applying coatings to large surfaces of flat workpieces.

Another advantage is the arrangement of the rod 16 carrying the spray gun 17 and movable in the slot 40 (FIG. 8) longitudinally and laterally inside the chamber 1 without affecting the thermal and acoustic insulation of the chamber 1 (FIG. 1) from the outside. The guide 7 of the tailstock 5 is made wear resistant thanks to securing the table 20 (FIG. 4) thereon acting to protect the planes of the guide 7 against powderlike ingredients of the material being applied to the workpiece. Automatic withdrawl of the spray gun 17 from the surface to which the coating is applied in case of unexpected stops of any of the drives 4 (FIG. 1), 14, 19 (FIG. 2) protects this surface against local thickening of the layer of coating applied thereto.

INDUSTRIAL APPLICAILITY

The invention can be used for applying all types of gas-thermal coatings to workpieces in the form of bodies of revolution, and to flat workpieces. In addition, the invention can find application in preparation of workpiece surfaces prior to applying coatings, such as for sand blasting the surfaces.

We claim:

1. A machine for applying gas-thermal coatings to workpieces comprising a box-like chamber, the chamber accommodating a headstock provided with a rotation drive, and a tailstock having a guide and capable of longitudinal movement relative to the workpiece along this guide, a carriage having a drive and a guide, the carriage being capable of longitudinal reciprocations along the guide relative to the workpiece, a rod carrying a spray gun and capable of lateral displacements relative to the workpiece in guides secured on the carriage, wherein the machine has a table secured on the guide of the tailstock, said tailstock having a hole of a size exceeding the cross-sectional dimensions of the table, a drive for imparting reciprocating motion to the rod relative to the workpiece and an arrangement for changing distance the rod can travel along said guide, a rear wall of the chamber having a longitudinally extending slot, the chamber having a gate slidable longitudinally relative to the workpiece and engageable with a hollow pusher which is secured on the carriage and receives the rod, the drive of the carriage and drive for imparting lateral reciprocations to the rod, as well as guides of the carriage and rod, being accommodated at the outer side of the rear wall of the chamber.

2. A machine as claimed in claim 1, wherein the drive for imparting lateral reciprocations to the rod has the form of a cam and a double-arm lever one arm of which is connected to the cam, whereas the other arm is connected to the rod.

3. A machine as claimed in claims 1 or 2, wherein the arrangement for changing the distance traveled by the rod comprises two slides capable of displacement in grooves, one such groove being provided in the carriage, whereas the other such groove is made in the double-arm lever of the drive for imparting lateral reciprocations to the rod, and a pivot pin secured in the slides.

4. A machine as claimed in claim 1, wherein the length and width of the table exceed the dimensions of planes of the guide of the tailstock engageable with the tailstock.

5. A machine as claimed in claim 2, wherein a cam of the drive for imparting lateral reciprocations to the rod has a shape conforming to the shape of the surface of the workpiece to which a coating is applied.

* * * * *